United States Patent
Gross et al.

(10) Patent No.: US 6,864,579 B2
(45) Date of Patent: Mar. 8, 2005

(54) CARRIER WITH A METAL AREA AND AT LEAST ONE CHIP CONFIGURED ON THE METAL AREA

(75) Inventors: Kurt Gross, Laaber (DE); Hans Rappl, Nittendorf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/057,154

(22) Filed: Jan. 25, 2002

(65) Prior Publication Data

US 2002/0100545 A1 Aug. 1, 2002

(30) Foreign Application Priority Data

Jan. 25, 2001 (DE) .......................................... 101 03 294

(51) Int. Cl.[7] .......................... H01L 23/50; H01L 21/58; H01L 23/498; H01L 23/495
(52) U.S. Cl. ...................... 257/751; 257/676; 257/703; 257/700; 257/E21.505; 257/E23.054; 257/E23.072; 257/E23.169; 257/701; 257/702; 257/771; 257/773; 257/772; 257/762; 257/765; 148/33.3; 156/278
(58) Field of Search .................. 257/703, 700, 257/701, 702, 676, 765, 766, 763, 769, 758, 762, 771–773; 156/278; 148/33.3

(56) References Cited

U.S. PATENT DOCUMENTS

| | | | |
|---|---|---|---|
| 4,220,696 A | * | 9/1980 | Tanaka et al. ................. 430/59 |
| 4,497,875 A | * | 2/1985 | Arakawa et al. ............ 428/620 |
| 4,872,047 A |   | 10/1989 | Fister et al. |
| 5,001,542 A | * | 3/1991 | Tsukagoshi et al. |
| 5,210,430 A | * | 5/1993 | Taniguchi et al. ............. 257/77 |
| 5,457,345 A | * | 10/1995 | Cook et al. .................. 257/766 |
| 5,654,586 A |   | 8/1997 | Schwarzbauer |
| 5,731,635 A | * | 3/1998 | Bareither et al. ............ 257/763 |
| 5,901,901 A | * | 5/1999 | Schneegans et al. ......... 257/508 |
| 5,998,238 A | * | 12/1999 | Kosaki ........................ 438/114 |
| 6,261,862 B1 | * | 7/2001 | Hori et al. ..................... 438/96 |
| 6,424,046 B1 | * | 7/2002 | Hong et al. .................. 257/762 |
| 6,448,585 B1 | * | 9/2002 | Kadota ......................... 257/103 |
| 2002/0001670 A1 | * | 1/2002 | Pauw et al. ..................... 427/98 |
| 2002/0074672 A1 | * | 6/2002 | Huang et al. ................ 257/788 |
| 2002/0096254 A1 | * | 7/2002 | Kober et al. .............. 156/307.3 |
| 2002/0106570 A1 | * | 8/2002 | Kami et al. ............... 430/58.05 |

FOREIGN PATENT DOCUMENTS

| | | | | |
|---|---|---|---|---|
| DE | 34 14 065 A1 | | 12/1985 | |
| EP | 0 139 205 A2 | | 5/1985 | |
| EP | 0701281 A2 | * | 3/1996 | |
| FR | 2 305 025 | | 10/1976 | |
| JP | 58-164232 | * | 9/1983 | ................ 148/33.3 |
| JP | 60-143636 | * | 7/1985 | ................. 257/677 |
| JP | 63-99557 | * | 4/1988 | ................. 257/751 |

* cited by examiner

*Primary Examiner*—Alexander Oscar Williams
(74) *Attorney, Agent, or Firm*—Laurence A. Greenberg; Werner H. Stemer; Gregory L. Mayback

(57) ABSTRACT

A carrier has a metal area that is essentially composed of copper. A chip has a rear side metallization layer. A buffer layer, essentially composed of nickel and having a thickness of between 5 $\mu$m and 10 $\mu$m, is arranged on the metal area. The chip does not have a chip housing and is arranged on the metal area, which has been provided with the buffer layer, such that only one connecting medium is arranged between the rear side metallization layer of the chip and the buffer layer.

7 Claims, 1 Drawing Sheet

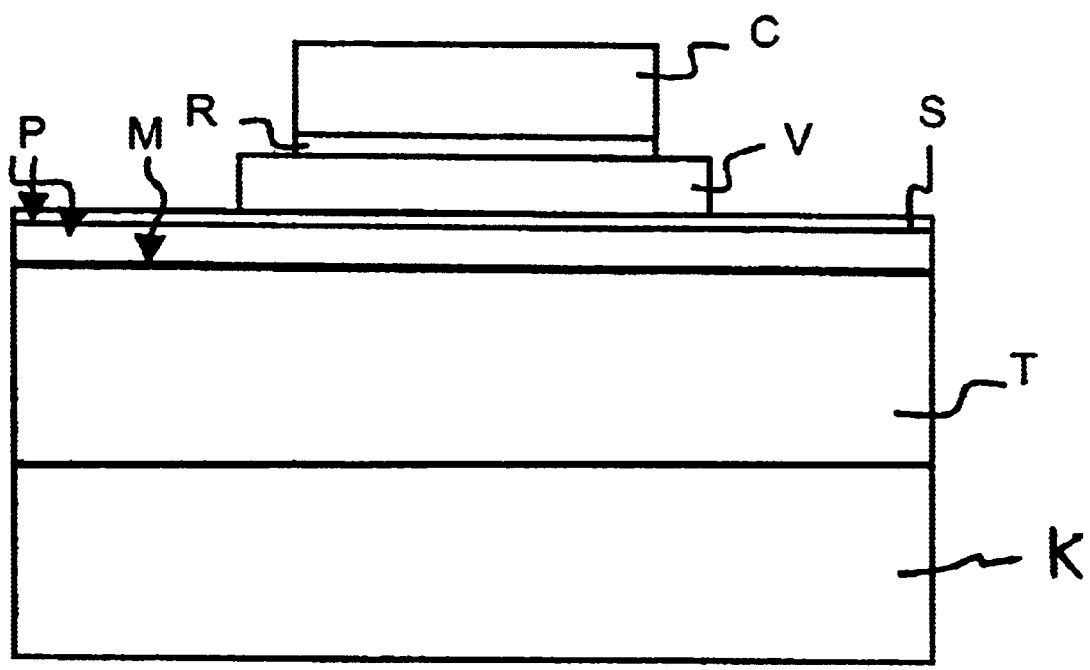

CARRIER WITH A METAL AREA AND AT LEAST ONE CHIP CONFIGURED ON THE METAL AREA

BACKGROUND OF THE INVENTION

Field of the Invention

The invention relates to a carrier and a chip connected to the carrier. The carrier has a metal area on which the chip is configured.

It is known to produce circuit arrangements using hybrid technology. To that end, chips, without a chip housing and with semiconductor components, are electrically contact-connected and are fixed directly onto a ceramic carrier in which conductor tracks made of copper are arranged. The chips have rear side metallization layers that directly adjoin metal areas made of copper that are arranged on the carrier. The metal areas made of copper are connected to the conductor tracks. In order to protect the metal areas against oxidation, it is known to provide the metal areas with a protective layer made of nickel having a thickness of approximately 1 $\mu$m to 2 $\mu$m.

If such a circuit arrangement is exposed to a relatively large number of large temperature fluctuations, it has been shown that the connection between the carrier and the chips becomes so brittle that the heat arising in the power semiconductor components contained in the chips can no longer be adequately dissipated, which leads to the destruction of the chips. The effect is presumably based on the different thermal expansion coefficients of the metal areas and the rear side metallization layers.

There are many applications requiring circuit arrangements that have a high stability with respect to temperature fluctuations. This is the case, for example, when a circuit arrangement is used in a motor vehicle. Indeed in very cold regions, a circuit arrangement arranged e.g. in a starter generator must withstand a change in temperature from –40° C. to +160° C. within approximately 10 seconds when the motor vehicle is started. It is desirable for such a circuit arrangement to withstand at least 1000, better more than 2000, such temperature cycles without damage.

SUMMARY OF THE INVENTION

It is accordingly an object of the invention to provide a carrier with a metal area and a chip configured on the metal area which overcomes the above-mentioned disadvantages of the prior art apparatus of this general type.

In particular, it is an object of the invention to provide a carrier with a metal area and at least one chip arranged on the metal area with a connection that is more stable with respect to temperature fluctuations when compared with the prior art.

With the foregoing and other objects in view there is provided, in accordance with the invention, a carrier and a chip configuration, that includes a carrier having a metal area essentially composed of copper; a chip having a rear side metallization layer; a buffer layer configured on the metal area, the buffer layer being essentially composed of nickel and having a thickness between 5 $\mu$m and 10 $\mu$m; and a connecting medium for fixedly connecting the chip to the carrier. the chip is configured, without a chip housing, on the metal area such that only the connecting medium is configured between the rear side metallization layer of the chip and the buffer layer.

In accordance with an added feature of the invention, the buffer layer has a thickness between 7 $\mu$m and 9 $\mu$m.

In accordance with an additional feature of the invention, the rear side metallization layer is essentially composed of aluminum.

In accordance with another feature of the invention, the buffer layer has a surface facing the chip, and the surface facing the chip includes a protective layer that is essentially composed of gold.

In accordance with a further feature of the invention, the carrier is essentially composed of copper.

In accordance with a further added feature of the invention, the carrier includes a plate made of ceramic, the metal area is applied above the plate, and the metal area serves as a contact area of the chip.

The chip does not have a chip housing and is configured on the metal area, which has been provided with the buffer layer, such that only one connecting medium for fixedly connecting the carrier to the chip is configured between the rear side metallization layer of the chip and the buffer layer.

It has been shown, surprisingly, that a buffer layer made of nickel and having a thickness between 5 $\mu$m and 10 $\mu$m greatly increases the stability of the connection between the carrier and the chip with respect to temperature fluctuations. The buffer layer presumably compensates for the different temperature coefficients of the metal area and the rear side metallization layer, or the buffer layer leads to a gentler temperature compensation between the metal area and the rear side metallization layer.

The configuration including such a carrier and chip can withstand more than 2000 temperature cycles without damage, in each of which, a change in temperature from –40° C. to +160° C. takes place within less than 10 seconds.

Bonded connections that are preferably composed of aluminum and extend from the top side of the chip as far as the carrier are also more stable because of the buffer layer.

The connection between the carrier and the chip is particularly highly stabile also sufficiently rapid heat transfer occurs between the carrier and the chip if the thickness of the buffer layer is between 7 $\mu$m and 9 $\mu$m, preferably about 8 $\mu$m.

The rear side metallization layer includes, for example, a multilayer metallization which may contain e.g. Cr, Ti, Ni, Au. All commercially available rear side metallization layers can be used.

The buffer layer may also have a thin oxidized layer at its surface in addition to nickel.

The buffer layer preferably contains, at its surface facing the chip, a protective layer that is essentially composed of gold. The protective layer protects the nickel of the buffer layer against oxidation. The protective layer preferably has a thickness of between 0.05 and 0.3 $\mu$m and is applied by chemical methods, for example. Reductive strengthening of the gold layer is possible.

Preferably, the carrier is essentially composed of the metal of the metal area. The carrier is thus essentially composed of a metal plate. Part of the metal plate forms the metal area. Since such a carrier serving as an electrical line has a significantly larger cross section than conductor tracks in a carrier made of ceramic, particularly high currents can be fed to the chip. Furthermore, the intermediate buffering and the dissipation of heat generated in the chip are significantly faster.

As an alternative, the carrier contains a plate made of ceramic, on which the metal area is applied as a contact area of the chip.

Other features which are considered as characteristic for the invention are set forth in the appended claims.

Although the invention is illustrated and described herein as embodied in a carrier with a metal area and at least one chip arranged thereon, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The sole drawing FIGURE is a cross sectional view of a carrier with a metal area, a buffer layer containing a protective layer, a connecting medium, and a chip.

DESCRIPTION OF THE PREFERRED EMBODIMENTS

Referring now to the sole drawing FIGURE, there is shown an exemplary embodiment of a carrier T and a chip C connected to the carrier C. The chip C does not have a chip housing and contains a power semiconductor. The chip C has a rear side metallization layer R made of aluminum (see the FIGURE).

The carrier T essentially includes a plate made of copper. The part of the carrier T on which the chip C is arranged is designated as the metal area M. The carrier T also includes a ceramic plate K applied below the metal area M.

A buffer layer P having a thickness of approximately 8 $\mu$m is applied on the carrier T. The buffer layer P is essentially composed of nickel, but has a surface facing the chip C that contains a protective layer S made of gold having a thickness of approximately 0.15 $\mu$m.

In order to fix the chip C onto the metal area M—provided with the buffer layer P—of the carrier T, a connecting medium V is configured between the rear side metallization layer R and the buffer layer P. The connecting medium V is composed of, for example, solder or a conductive adhesive.

We claim:

1. A carrier and a chip configuration, comprising:

a carrier having a metal area substantially composed of copper;

a chip having a rear side metallization layer;

a buffer layer configured on said metal area, said buffer layer being substantially composed of nickel and having a thickness between 5 $\mu$m and 10 $\mu$m; and a connecting medium for fixedly connecting said chip to said carrier;

said chip being configured, without a chip housing, on said metal area such that only said connecting medium is configured between said rear side metallization layer of said chip and said buffer layer.

2. The carrier and the chip configuration according to claim 1, wherein said buffer layer has a thickness between 7 $\mu$m and 9 $\mu$m.

3. The carrier and the chip configuration according to claim 2, wherein said rear side metallization layer is substantially composed of aluminum.

4. The carrier and the chip configuration according to claim 1, wherein said rear side metallization layer is substantially composed of aluminum.

5. The carrier and the chip configuration according to claim 1, wherein said buffer layer has a surface facing said chip, and said surface facing said chip includes a protective layer that is substantially composed of gold.

6. The carrier and the chip configuration according to claim 1, wherein said carrier is substantially composed of copper.

7. The carrier and the chip configuration according to claim 1, wherein said carrier includes a plate made of ceramic, said metal area is applied above said plate, and said metal area forms a contact area for said chip.

* * * * *